(12) United States Patent
Saye

(10) Patent No.: US 8,946,880 B2
(45) Date of Patent: Feb. 3, 2015

(54) PACKAGED SEMICONDUCTOR DEVICE HAVING MULTILEVEL LEADFRAMES CONFIGURED AS MODULES

(71) Applicant: Texas Instruments Incorporated, Dallas, TX (US)

(72) Inventor: Richard J. Saye, Greenville, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 13/848,771

(22) Filed: Mar. 22, 2013

(65) Prior Publication Data
US 2013/0249051 A1    Sep. 26, 2013

Related U.S. Application Data

(60) Provisional application No. 61/615,002, filed on Mar. 23, 2012.

(51) Int. Cl.
| | | |
|---|---|---|
| *H01L 23/02* | (2006.01) | |
| *H01L 23/495* | (2006.01) | |
| *H01L 21/56* | (2006.01) | |
| *H01L 23/00* | (2006.01) | |
| *H01L 23/31* | (2006.01) | |

(52) U.S. Cl.
CPC .... *H01L 23/49568* (2013.01); *H01L 23/49575* (2013.01); *H01L 21/56* (2013.01); *H01L 24/97* (2013.01); *H01L 23/495* (2013.01); *H01L 23/49537* (2013.01); *H01L 23/49551* (2013.01); *H01L 21/561* (2013.01); *H01L 23/3107* (2013.01)

USPC .......... 257/686; 257/528; 257/662; 257/672; 257/676; 257/692

(58) Field of Classification Search
CPC .............. H01L 23/495; H01L 23/4951; H01L 23/49524; H01L 23/49537; H01L 23/49544; H01L 23/49551; H01L 23/49575
USPC .......... 257/686, 528, 662, 672, 676, 692, 691
See application file for complete search history.

(56) References Cited

U.S. PATENT DOCUMENTS

| | | |
|---|---|---|
| 2002/0024857 A1 | 2/2002 | Stave |
| 2004/0014257 A1* | 1/2004 | Kim et al. ..................... 438/111 |
| 2007/0001274 A1 | 1/2007 | Hinkle et al. |
| 2007/0181990 A1 | 8/2007 | Huang et al. |
| 2009/0194855 A1 | 8/2009 | Liu et al. |
| 2011/0089546 A1 | 4/2011 | Bayan |

* cited by examiner

*Primary Examiner* — Tan N Tran
(74) *Attorney, Agent, or Firm* — Steven A. Shaw; Frederick J. Telecky, Jr.

(57) ABSTRACT

A semiconductor system (100) has a first planar leadframe (101) with first leads (102) and pads (103) having attached electronic components (120), the first leadframe including a set of elongated leads (104) bent at an angle away from the plane of the first leadframe; a second planar leadframe (110) with second leads (112) and pads (113) having attached electronic components (114); the bent leads of the first leadframe conductively connected to the second leadframe, forming a conductively linked 3-dimensional network between components and leads in two planes; and packaging material (140) encapsulating the 3-dimensional network.

12 Claims, 9 Drawing Sheets

PACKAGED SEMICONDUCTOR DEVICE HAVING MULTILEVEL LEADFRAMES CONFIGURED AS MODULES

CROSS-REFERENCE TO RELATED APPLICATIONS

This application claims the benefit of the filing date of U.S. Provisional Patent Application No. 61/615,002, which is titled "System in Package (SIPO with Stacked Inductor" and was filed on Mar. 23, 2012, the disclosure of which is hereby incorporated by reference herein in its entirety.

FIELD OF THE INVENTION

The present invention is related in general to the field of semiconductor devices and processes, and more specifically to structure and fabrication method of an electronic system having interconnected modular multilevel leadframes.

DESCRIPTION OF RELATED ART

Among the long-term trends in semiconductor technology which continue unabated are the trends towards miniaturization, integration, and speed. In addition to these trends, recent years have shown emerging product demands for greater flexibility to satisfy customization of products and for reducing the time needed to bring these products to market. A specific product example may illustrate these demands.

Electronic products in commercial applications such as telecom, home audio, and regulator products often need systems, which can switch power supplies, regulate and stabilize voltages, and work as converters from one DC voltage to another DC voltage. These systems not only need to have high efficiency to operate properly, but should preferably also have small lateral and thickness dimensions, and require very low cost.

Popular power switch systems involve a metal leadframe with dimensions of about 10 mm to 20 mm, onto which a plurality of discrete electronic components are assembled and overmolded as a unit. The height of the overmolded power system is presently between 2 mm and 3 mm. The components of a power supply may include a half bridge (or Power Block); an assortment of resistors and capacitors; and a packaged load inductor for energy storage. In operation, the components have to stay cool by effectively dissipating heat to heat sinks so that they can switch fast (fast transient response).

The components of a half bridge (or Power Block) may include two MOS field effect transistors (FETs) with low resistance and large current handling capability, connected in series and coupled together by a common switch node; further an assortment of resistors and capacitors; and a packaged load inductor for energy storage. When a regulating driver is added, the assembly is referred to as Power Stage or synchronous Buck converter. In the synchronous Buck converter, the control FET chip, also called the high-side switch, is connected between the supply voltage $V_{IN}$ and the LC output filter, and the synchronous (sync) FET chip, also called the low side switch, is connected between the LC output filter and ground potential. The gates of the control FET chip and the sync FET chip are connected to a semiconductor chip including the circuitry for the driver of the converter and the controller; the chip is also connected to ground potential.

The switch node of the power supply assembly is connected to an output load inductor serving as the energy storage of the power supply circuit; the inductor has to be large enough to reliably function for maintaining a constant output voltage. A conventional packaged inductor includes a spirally configured coil of coated copper wire welded to a plated copper leadframe and molded into a magnetic ferrite material. The inductor is encapsulated by a cuboid-shaped packaging compound. Due to its size, the package load inductor is the dominant component of the power supply assembly relative to volume and to consumption of real estate both of the leadframe and later of a printed circuit motherboard (PCB). Even for close proximity between inductor and FETs, and to circuitry capacitors, there are connecting traces, which necessarily introduce parasitic resistances and inductances.

It would be advantageous to have greater flexibility in satisfying customer demands for different power inputs and different power outputs and accomplish the modification in quick turn-around time.

It would be advantageous to have an assembly of the power converter which consumes less real estate of board space and thus conserves valuable size of the end product.

It would be advantageous to reduce the cost of manufacturing while fulfilling the above stated goals.

SUMMARY OF THE INVENTION

Analyzing technical barriers which prominently limit the endeavor of shrinking valuable real estate consumption, applicant realized that vertical stacking would often be an attractive solution if the problem of vertical electrical interconnection from level to level within the stack could be solved. In order to satisfy general market requirements, any solution has to be low cost and flexible relative to customer specifications.

Applicant solved the problem of low-cost vertical electrical interconnections within a vertically stacked device, when he discovered a device structure employing two planar leadframes, wherein the first leadframe includes a first set of elongated leads bent away from the plane of the leadframe so that they can be conductively connected to the second leadframe. In addition, the first leadframe can be constructed so that it can be pre-assembled as a module wherein attached components can be readily varied according to customer specifications; the module may have the same footprint as the device but offer different content.

The concept of bending leads away from the plane of the leadframe can be extended to include a second set of elongated leads of the first leadframe, which are bent in a direction away from the plane of the leadframe in a direction opposite to the direction of the first set leads. The second set leads allow conductive connection to a third planar leadframe with pads having attached electronic components.

An exemplary described embodiment is a packaged device with two vertically stacked planar QFN-type (Quad Flat No-Leads) leadframes. The first leadframe has pads for attaching resistors, capacitors and a bulky encapsulated inductor. In addition to standard QFN-type leads in the plane of the leadframe, the first leadframe has a set of elongated leads bent in a direction away from the plane of the leadframe. The bent leads are suitable to be conductively connected (for instance by solder) to a second leadframe. The second planar leadframe has pads for attaching semiconductor chips, resistors, and capacitors. The leadframe has QFN-type leads; in some devices, it may also have cantilever-type leads. After a process of conductively attaching the bent leads of the first leadframe to the second leadframe, the assembled device is encapsulated in packaging material.

Another described embodiment of the invention is a method for fabricating a vertically stacked leadframe-based semiconductor device. As an interim step, the method results in the assembly of modules, which can be modified easily according the upcoming customer specifications. On the pads of a first planar leadframe, electronic components are assembled, especially bulky and dominating parts such as inductors. The first leadframe includes a first set of elongated leads, which are bent in a first direction away from the plane of the first leadframe. On the pads of a second planar leadframe, electronic components are assembled, especially semiconductor chips with or without package. The assembled first leadframe is aligned with the assembled second leadframe so that the bent elongated first set leads of the first leadframe are brought into touch with the second leadframe. The elongated first set leads are conductively connected to the second leadframe, preferably by soldering, whereby a 3-dimensional conductively linked network of components and leads is created.

BRIEF DESCRIPTION OF THE DRAWINGS

FIGS. 2 to 6 depicts steps of the process flow for fabricating exemplary packaged semiconductor devices with two planar leadframes configured as modules and interconnected 3-dimensionally.

FIG. 2 shows a perspective view of a portion of a strip of a first planar leadframe, wherein the units have a first set of elongated leads bent in a first direction away from the plane of the first leadframe.

FIG. 4 depicts a perspective view of a portion of a strip of a second planar leadframe with pads suitable for attaching packaged electronic components.

FIG. 5 illustrates a perspective view of the leadframe strip of FIG. 4 with electrical components attached, each unit representing a module.

FIG. 6 depicts the process step of aligning the assembled first leadframe with the assembled second leadframe to bring the bent elongated leads of the first leadframe into touch with the second leadframe.

DETAILED DESCRIPTION OF THE PREFERRED EMBODIMENTS

Figure 1:
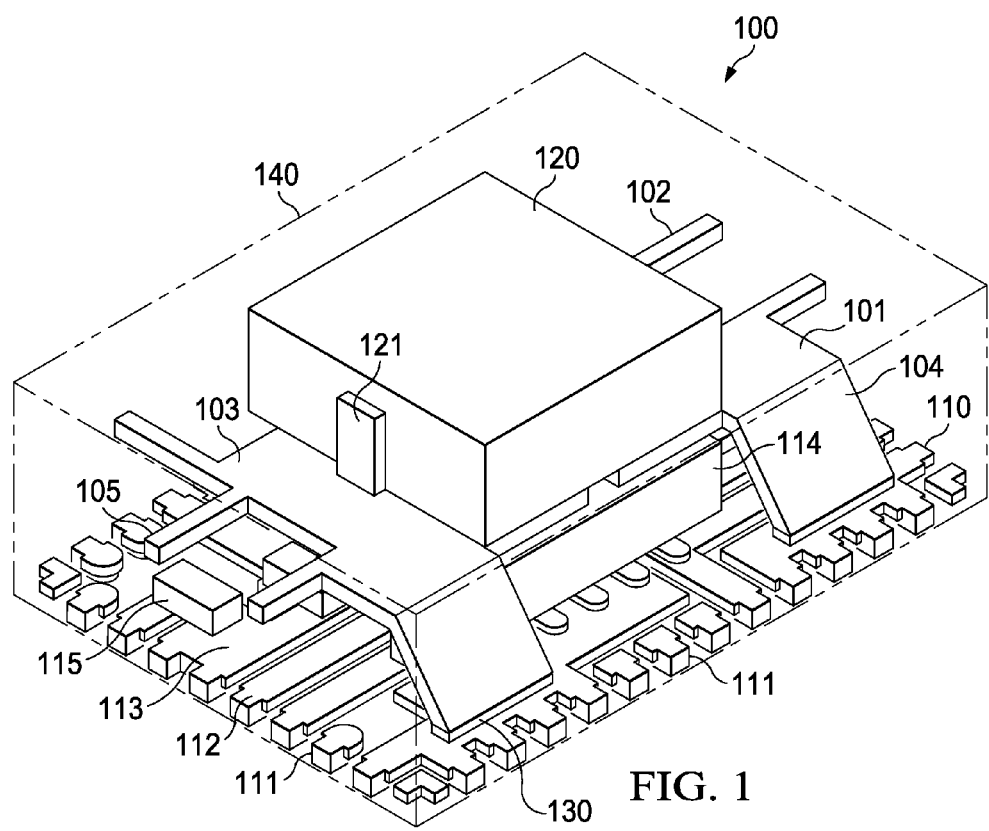
FIG. 1 illustrates a perspective view of a packaged semiconductor device having multi-level planar leadframes configured as modules, with bent leads of one planar leadframe providing connections to the other planar leadframe.

FIG. 1 displays a perspective view of an exemplary packaged electronic system generally designated 100. The system is based on two QFN/SON-type planar metal leadframes; the first planar leadframe is designated 101, the second planar leadframe is designated 110. Both leadframes include pads for attaching components, and leads for interconnection. Both leadframes are etched or stamped from sheets of metal, preferably in the thickness range from about 100 μm to 250 μm. Preferred metals include, but are not limited to, copper, copper alloys, iron-nickel alloys, aluminum, and Kovar™. The metal of the first leadframe is called the first metal, and the metal of the second leadframe is called the second metal. For some applications of the packaged system, it is a technical advantage that the metal of the second leadframe may be selected to be different from the first metal. Further, the metal thickness of the second leadframe may be the same as the metal thickness of the first leadframe, or it may be selected to be different.

In the exemplary device shown in FIG. 1, the first planar leadframe 101 has first leads 102 and first pads 103. The pads are designed so that they are suitable for attaching electronic components; FIG. 1 illustrates a bulky inductor 120 attached by clips 121 to pads 103. Other devices may have pads designed for attaching one or more components, small size or voluminous, including packaged and unpackaged passive and active components such as resistors, capacitors, and semiconductor chips. It is a technical advantage that the first leadframe is especially suitable to carry heat-generating components due to the eventual proximity to an external heat sink, which may attached to the packaging material or even the surface of the component. The pads of the first leadframe may be interconnected by leads. As a result, first leadframe 101 may be configured as a sub-assembly or a module, which can be fabricated as a self-contained unit.

Figure 7:
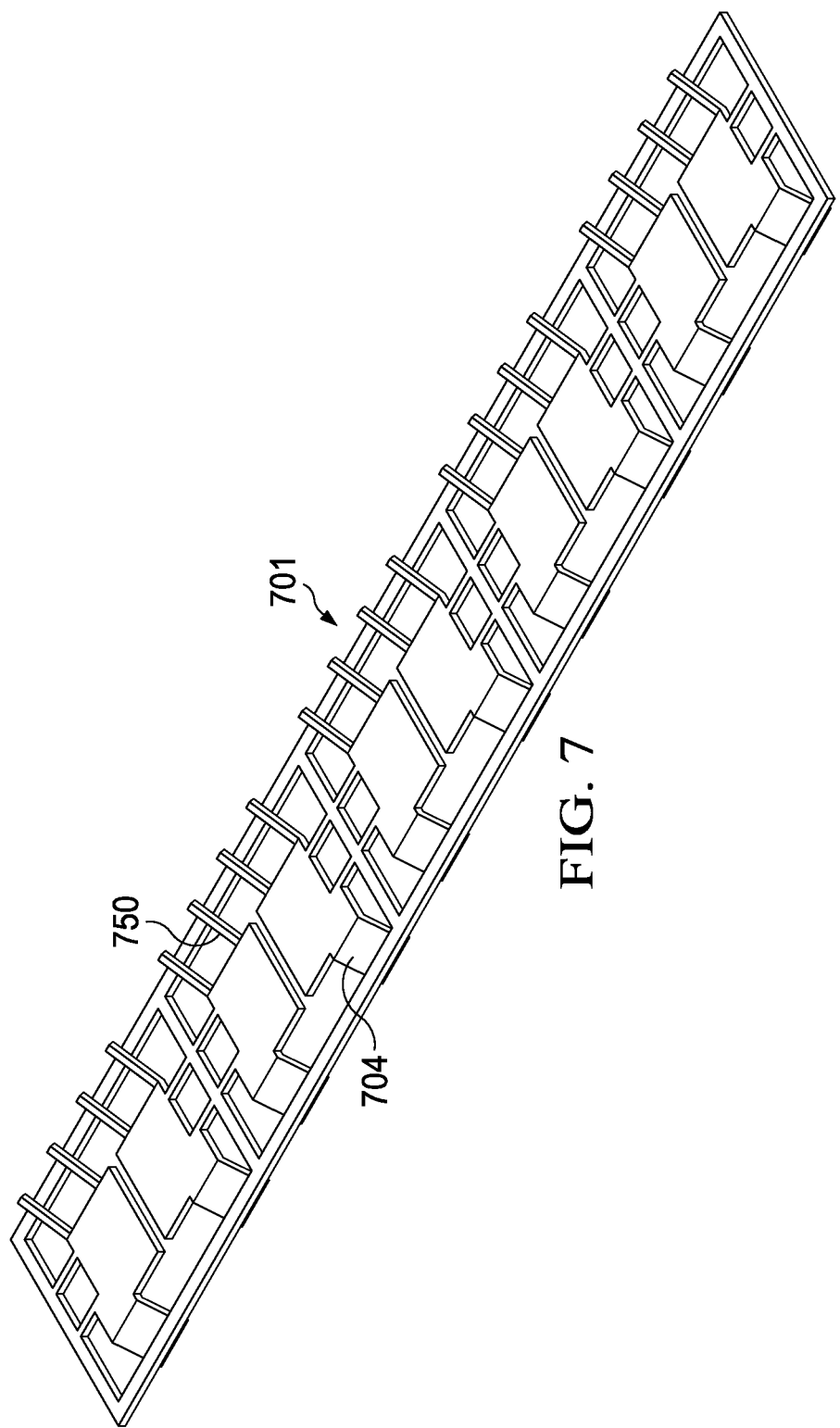
FIG. 7 shows a perspective view of a portion of a strip of another first planar leadframe, wherein the units have a first set of elongated leads bent in a first direction away from the plane of the first leadframe and a second set of elongated leads bent in a second direction away from the plane of the first leadframe.

In addition, planar first leadframe 101 includes a set of elongated leads 104, which are bent in a direction away from the plane of first leadframe 101. The set of elongated leads 104 is referred to herein as first set, and the direction of the bent leads is referred to herein as first direction, since leadframe 101 may include additional sets of leads bent in a different direction, as illustrated in FIG. 7. As discussed below, the orientation of the first set leads is obtained by a process of bending, or forming, which is accomplished by an outside force acting on the elongated leads in the phase of fabricating the leadframe.

In the embodiment shown in FIG. 1, the second leadframe 110 has, like generally for Quad Flat No-Lead (QFN) and Small Outline No-Lead (SON) devices, no metallic second leads shaped as cantilevers, which would protrude from the device package; rather, the metallic contacts for electrical connection and for board attach (by pressure or soldering) are provided by flat metal terminals 111. As FIG. 1 indicates, the lead ends 111, shaped as flat terminals, are arrayed along the periphery of leadframe 110. Second leadframe 110 further has second leads 112 for interconnection within the leadframe and a plurality of pads 113 (shown in more detail in FIG. 4), which are suitable to support attached electronic components. FIG. 1 depicts as examples of components a packaged semiconductor chip 114 and some packaged or unpackaged passive components 115 such as resistors and capacitors. As a result, second leadframe 110 is configured as a module, which can be fabricated as a self-contained unit.

FIG. 1 illustrates that bent elongated leads 104 of the first leadframe 101 are conductively connected to second leadframe 110 by connection material 130. A preferred connection material is solder; other materials include silver-filled epoxy and z-axis conductive adhesive. Due to the conductive connection between planar leadframes 101 and 110, bent leads 104 enable the formation of a conductively linked three-dimensional network between components and leads in two planes defined by the two planar leadframes designed as modules.

As FIG. 1 further shows, electronic system 100 includes a package 140 made of polymeric material, which encapsulates the three-dimensional network while leaving portions of the first and second leads, such as one surface of the flat terminals 111, un-encapsulated and thus operable as electronic device terminals and contacts of system 100. As a result, package 140 of system 100 is shaped as a cuboid with the surface of second leads 111 providing the system terminals.

FIG. 1 indicates that some lead ends 105 of first leadframe 101 are exposed from the encapsulation material after singulating the unit from the strip. Lead ends 105 may thus operate as device terminals located in a plane different from the plane of second leadframe leads 111. The possibility of device terminals in different planes of the device encapsulation represents a technical advantage for certain product applications.

Figure 2:
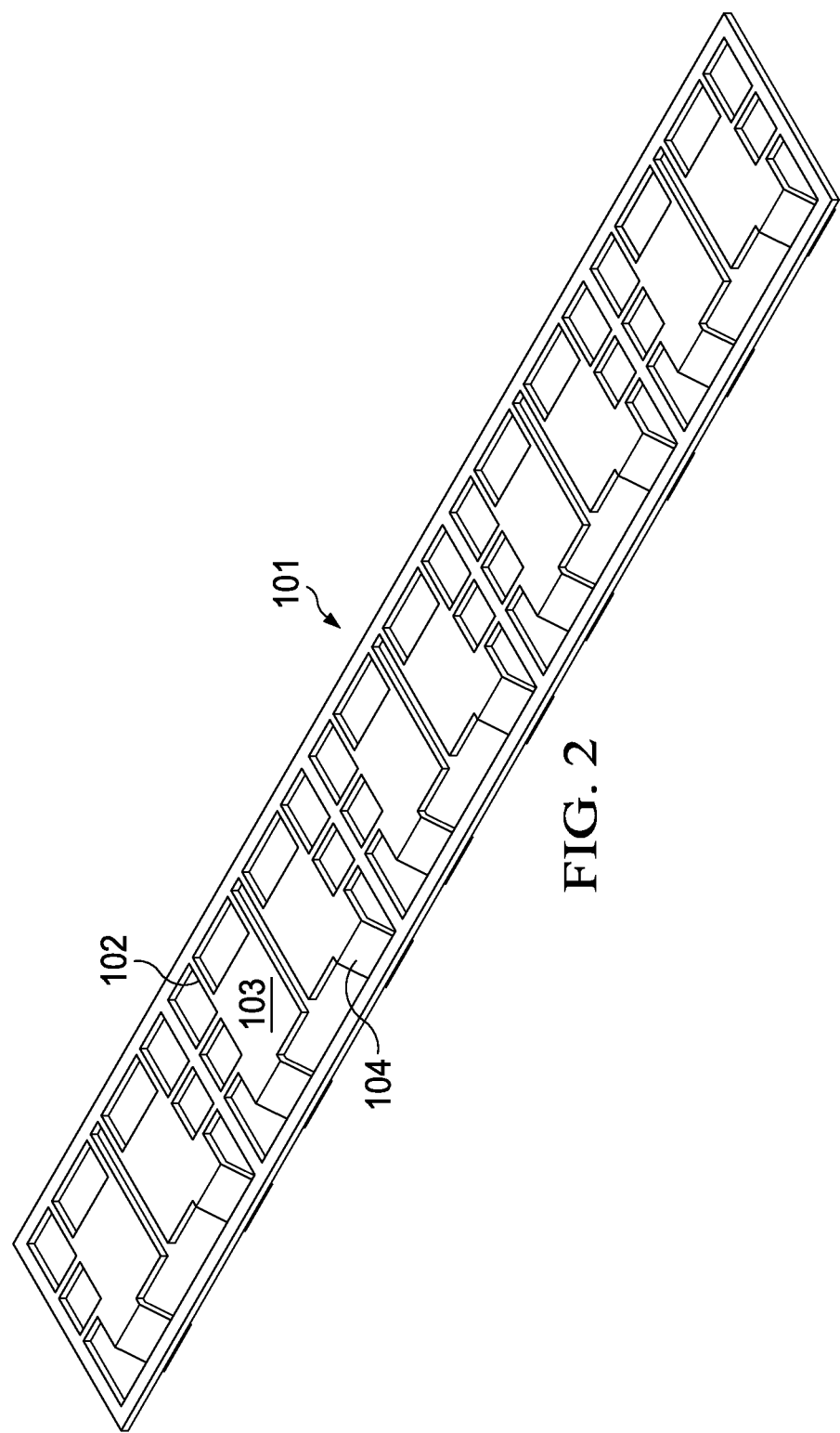

As mentioned, the first and the second leadframe are preferably fabricated from flat sheets of metal. FIGS. 2 to 6 depict steps of the process flow for fabricating exemplary packaged semiconductor systems with two planar leadframes configured as modules and interconnected 3-dimensionally. A strip of an exemplary first planar leadframe 101 is depicted in FIG. 2. The illustration shows examples of first leads 102, first pads 103, and elongated leads 104. As a set (called the first set), elongated leads 104 are bent in a first direction away from the original plane of the flat first leadframe. The process of bending, or forming, is accomplished by an outside force acting on the flat elongated leads. While the strip is clamped in a horizontal plane, a force is applied to the leads of the first set in order to press them into the desired direction. The elongated leads have to absorb this force by stretching. The applied force stretches the lead in the direction of the length, while the dimension of the width is only slightly reduced so that the new shape appears to have some additional elongation. For additional elongations small compared to the original length, and up to a limit called the elastic limit given by the material characteristics, the amount of additional elongation is linearly proportional to the force. Forced stretches can cover shallow angles (about 30° or less). If necessary, a multi-step configuration at angles of about 40° or less can be adopted to cover wider distances. As a side benefit, these configurations enhance mold locking of plastic to the leadframe in transfer molded plastic packages.

Figures 3A, 3B:
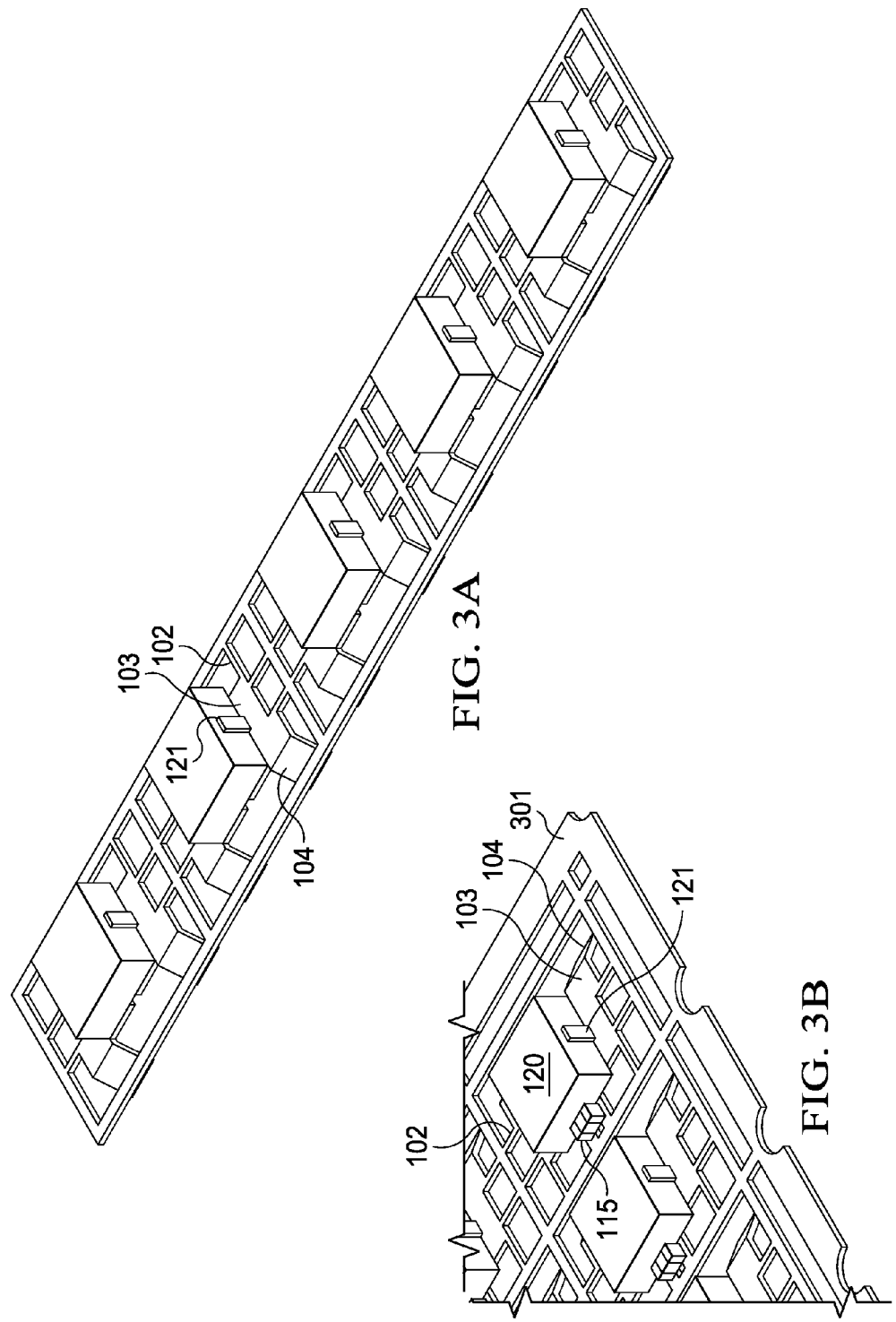
FIG. 3A illustrates a perspective view of the leadframe strip of FIG. 2 with electrical components attached, each unit representing a module.
FIG. 3B shows a perspective view of another portion of a first planar leadframe with electrical components attached, emphasizing the first set of elongated leads bent in a first direction away from the plane of the first leadframe.

FIGS. 3A and 3B show strips of first planar leadframe 101 to illustrate the process step of attaching exemplary components onto the pads of a first leadframe strip including a plurality of module sites. The plane of first leadframe 101 is highlighted in FIG. 3B by the flat frame 301 of the leadframe. In FIG. 3A, an inductor 120, encapsulated in its own housing, is attached to first pads 103 with the help of clamps 121; in FIG. 3B, an additional component such as a capacitor 115 is added to the inductor. The preferred method of attaching is soldering; an alternative method uses a conductive adhesive. The process step of attaching the components can be performed at a separate assembly site and results in a self-contained module, which can be shipped to another assembly site for further processing. FIGS. 3A and 3B depict the first set of elongated leads 104, which are bent in a first direction away from the plane of the first leadframe strip.

Figure 4:
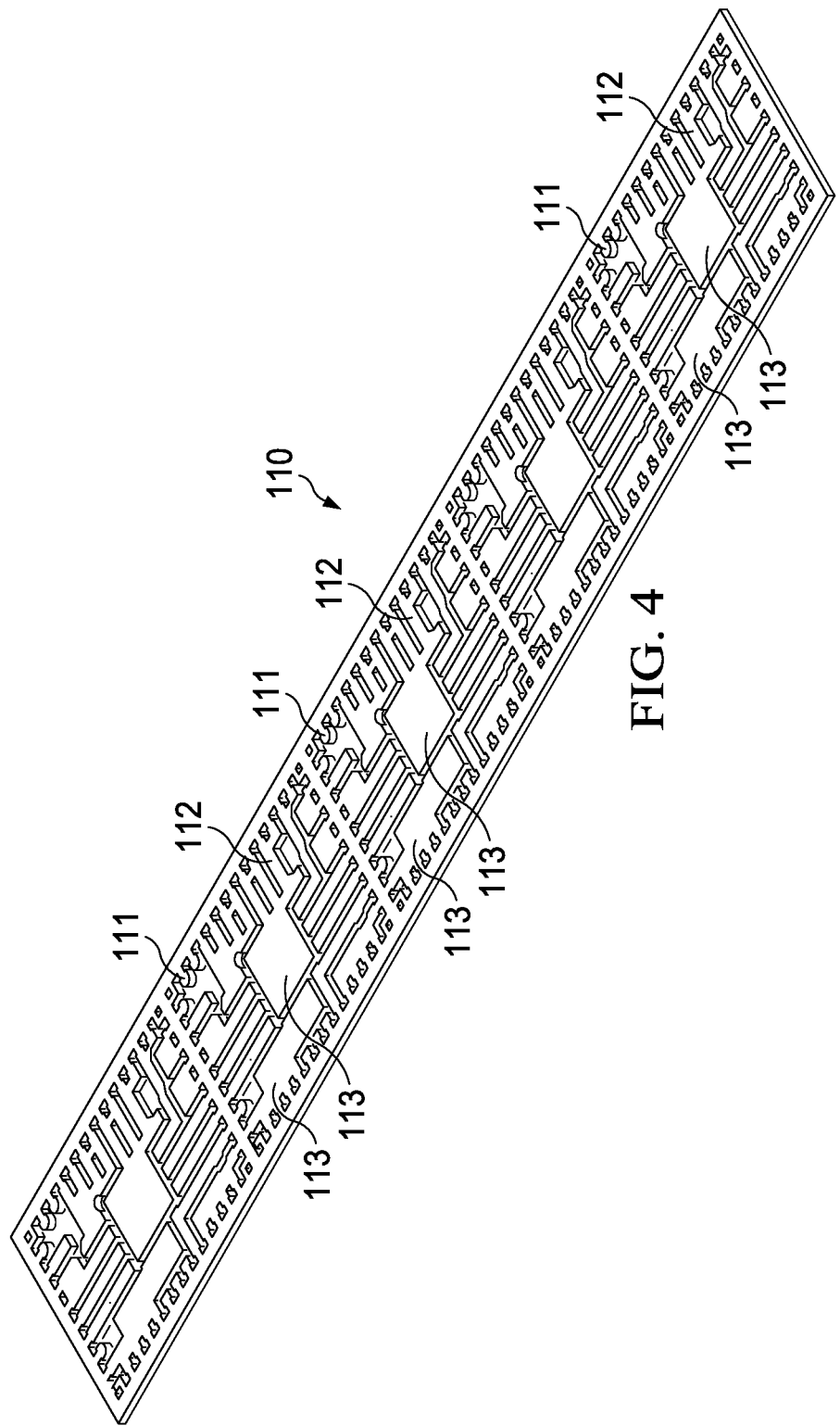

A strip of an exemplary second planar leadframe 110 is depicted in FIG. 4. The illustration shows examples of terminals 111, second leads 112, and second pads 113. In the example of FIG. 4, no leads are bent in a direction away from the plane of second leadframe 110; however, for other applications (see also FIG. 8) second leadframe 110 may include one or more, or a set of, elongated leads bent at an angle away from the plane of second leadframe 110. A frequently used application involves elongated leads which can be bent as cantilevers for surface mount attachment to circuit boards.

Figure 5:
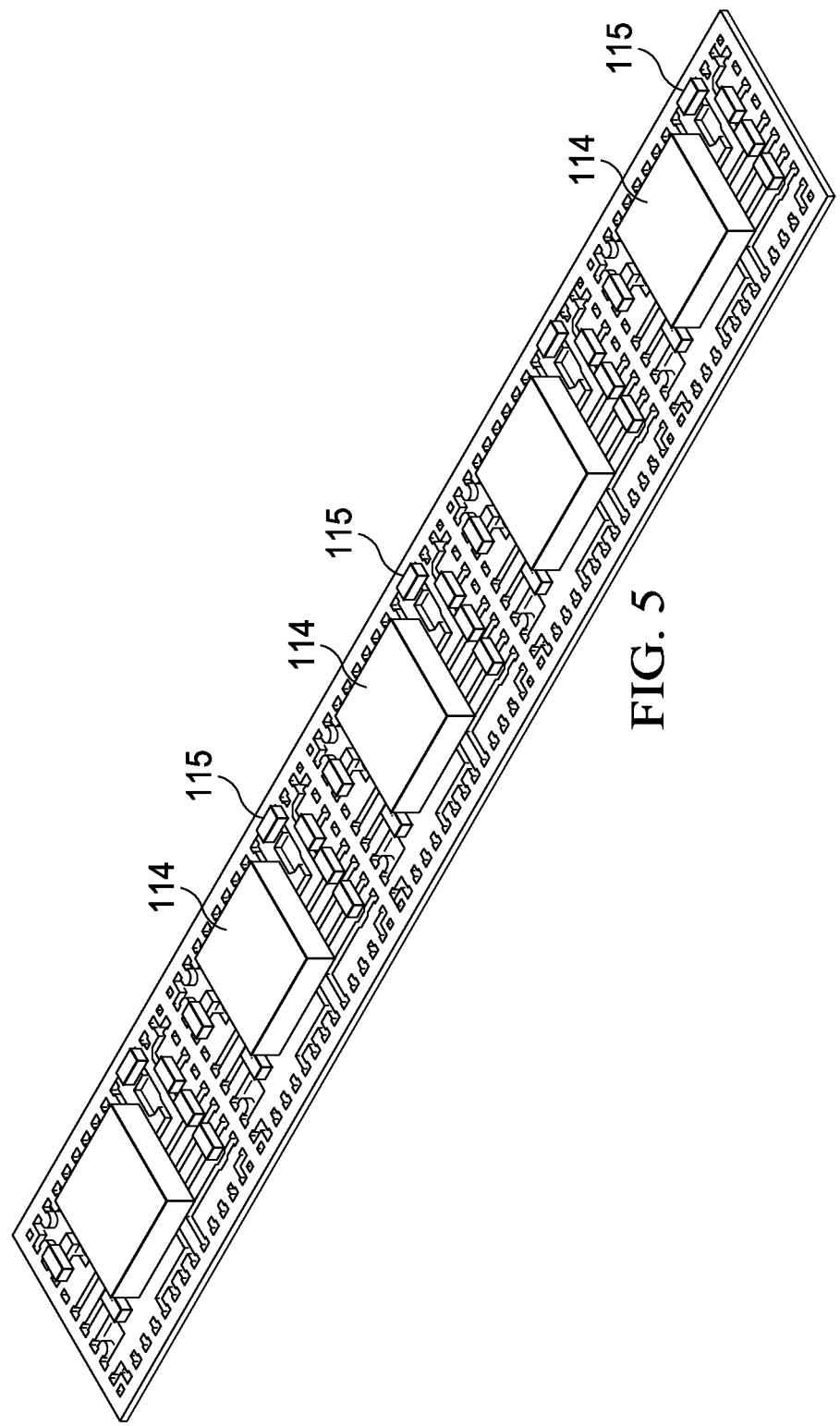

FIG. 5 shows a strip of second planar leadframe 110 to illustrate the process step of attaching exemplary components onto the pads of the second leadframe strip of FIG. 4 including a plurality of module sites. In FIG. 5, a semiconductor chip 114 encapsulated in its own housing and a plurality of additional components such as capacitors and resistors are attached to second leadframe strip 110. The preferred method of attaching is soldering; an alternative method uses a conductive adhesive. The process step of attaching the components can be performed at a separate assembly site and results in a self-contained module, which can be shipped to another assembly site for further processing.

Figure 6:
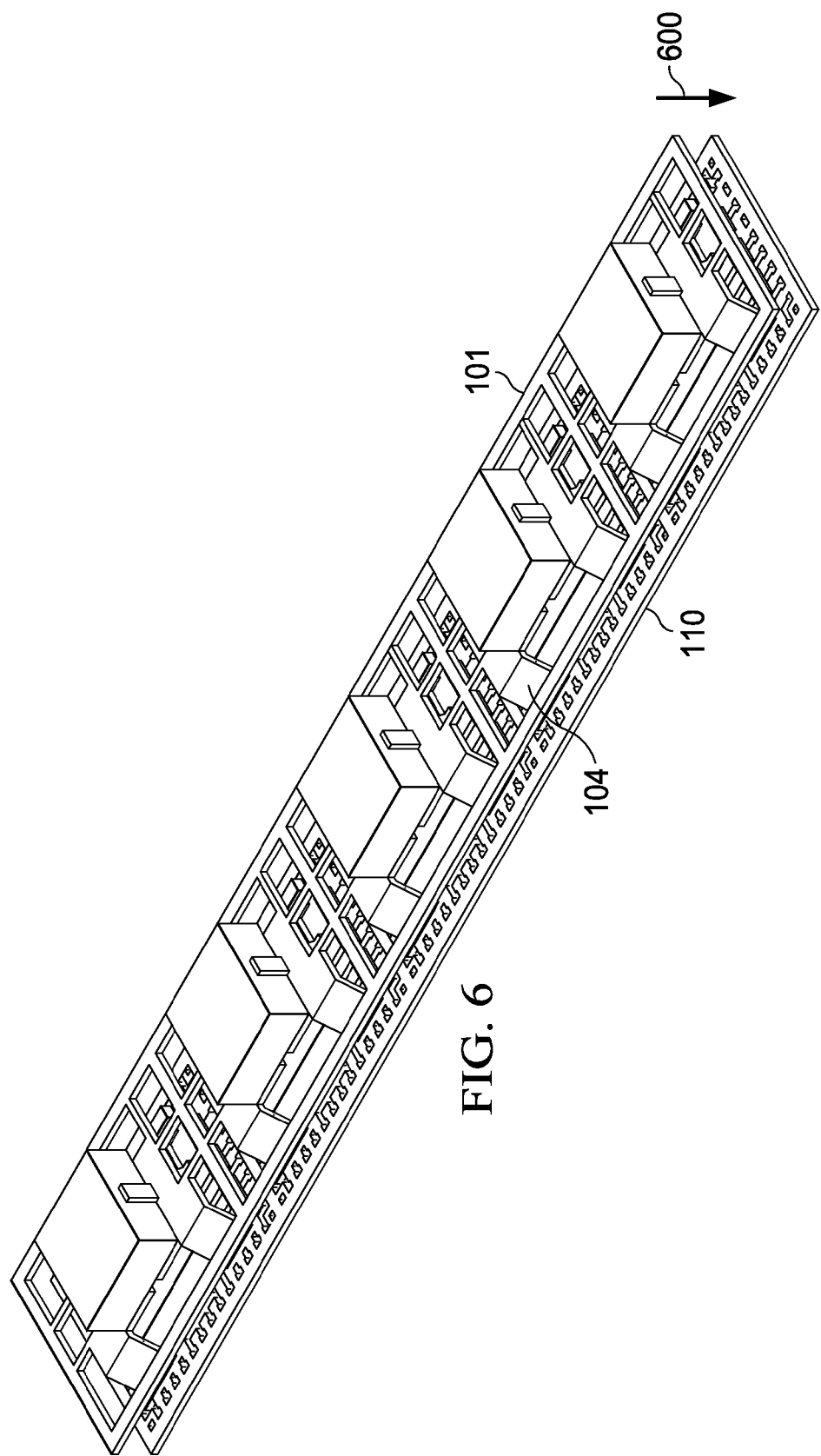

Indicated by arrow 600, FIG. 6 illustrates the process step of aligning the assembled strip of first leadframe 101 with the assembled strip of second leadframe 110 in order to bring the set of bent elongated first leads 104 of first leadframe 101 into touch with second leadframe 110.

In the next process step, the set of elongated first leads 104 of first leadframe 101 is conductively connected to second leadframe 110. A preferred connection material is solder; other materials include silver-filled epoxy and conductive adhesives such as z-axis conductive adhesive. Due to the conductive connection between planar leadframes 101 and 110, bent leads 104 enable the formation of a conductively linked 3-dimensional network between components and leads in two planes defined by the two planar leadframes designed as modules.

In the next process step, the 3-dimensional network is encapsulated in a packaging compound. A preferred method is a transfer molding technology using an epoxy-based molding compound filled with inorganic filler particles. As stated above, metal parts intended as device terminals remain un-encapsulated. For some product applications, it is necessary to encapsulate the components attached to the first leadframe fully; for other products, it is a technical advantage to leave at least the top surface of a major component such as the inductor shown in FIG. 1 un-encapsulated so that a heat sink can be attached.

Rapidly increasing product applications in widely different environments, such as wireless communication with handheld products and automotive controls with steep swings of temperature, require modifications of the module concept with multi-level leadframes. FIGS. 7 to 10 illustrate a few examples of leadframe variations found useful for some of these applications. FIG. 7 shows an example of a planar leadframe 701 (the plane indicated by the flat assembly pads), which not only has a first set of elongated leads 704 bent in a first direction away from the plane of leadframe 701, but also has a second set of elongated leads 750 bent in a second direction away from the plane of the leadframe 701. The second direction is approximately opposite to the first direction, dependent on the angle of bending. Using leadframe 701 as first leadframe in place of leadframe 101 in a system similar to the system of FIG. 1 allows the newly formed alternative packaged device to obtain access to another plane available for additional device functions, such as another integrated circuit chip, or passive heat sinks.

Figure 8:
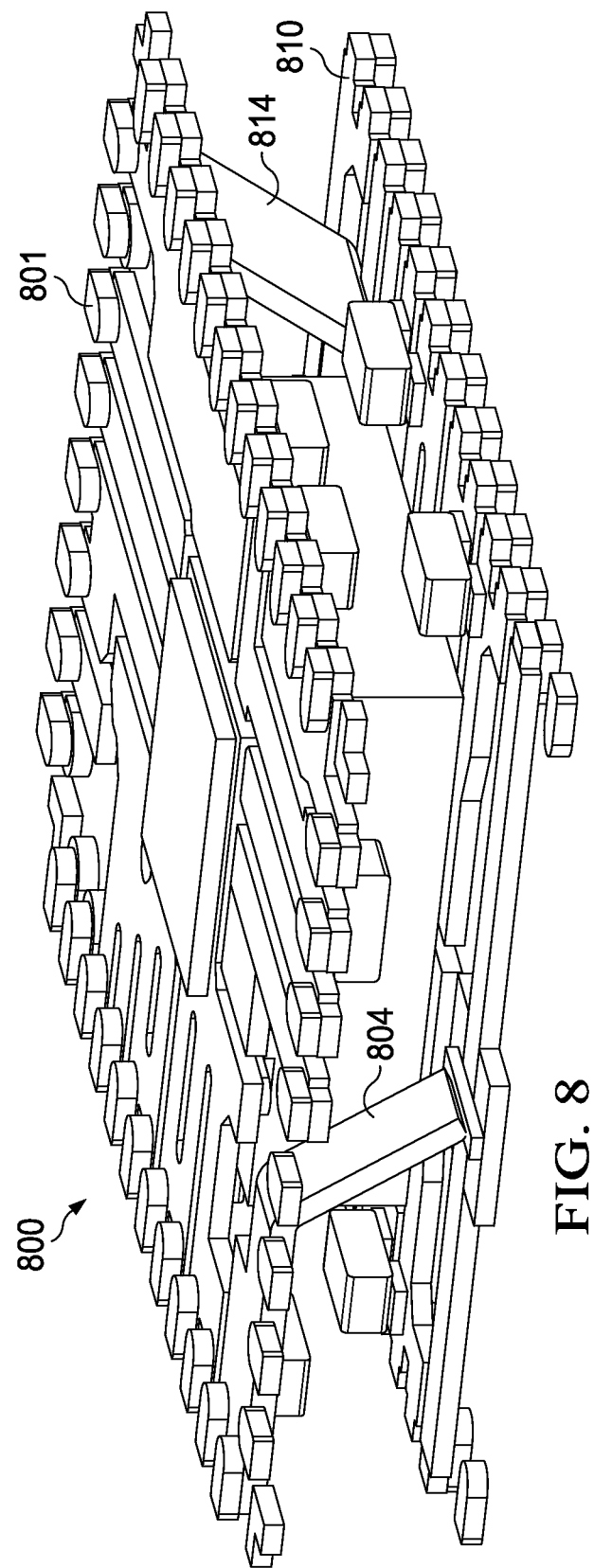
FIG. 8 illustrates a perspective view of a packaged semiconductor device having multi-level planar leadframes configured as modules, with bent leads provided by both planar leadframes establishing connections from one planar leadframe to the other planar leadframe.

Another example of planar leadframes designed for building a 3-dimensional network 800 between electronic components is shown in FIG. 8. The first leadframe 801 has a first set of elongated leads 804 bent in a first direction away from the plane of the first leadframe. As illustrated, these leads 804 are used to conductively interconnect the components assembled on first leadframe 801 (not shown in FIG. 8) and second leadframe 810. In addition, second planar leadframe 810 has a second set of elongated leads 814 bent in a second direction away from the plane of the second leadframe. In the example of FIG. 8, the second direction is in the same direction as the first direction. Consequently, leads 814 support the conductive interconnection of the components assembled on first leadframe 801 and second leadframe 810.

Figure 9:
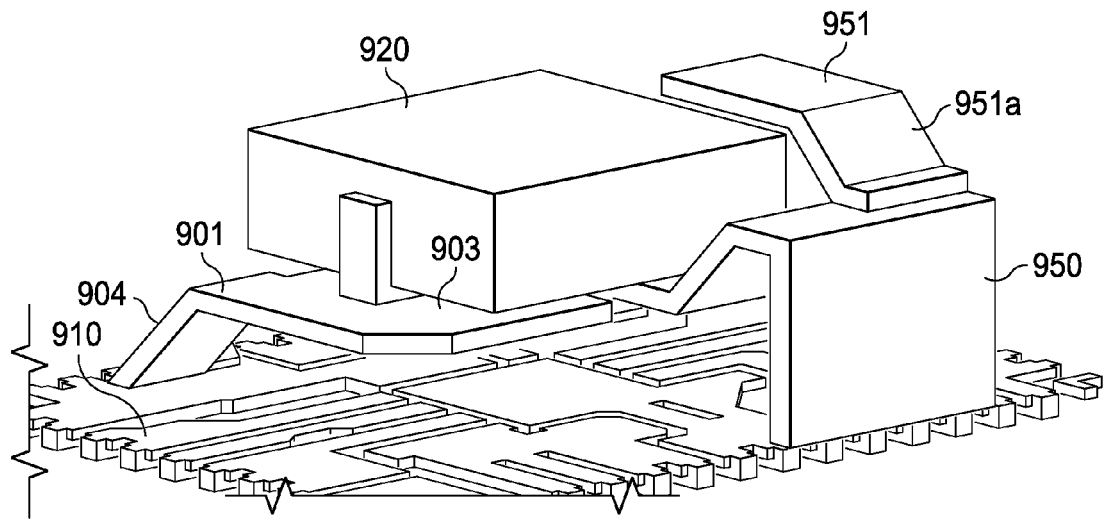
FIG. 9 shows a perspective view of a module where bent leads of one leadframe are resigned as heat spreaders.

FIG. 9 illustrates an exemplary first leadframe 901, which not only has bent leads 904 to connect to second leadframe 910, but is also designed to have pads and elongated leads with a geometry suitable to spread thermal energy in order to dissipate heat. In FIG. 9, one of the pads for attaching inductor 920 widens to area 950, which extends across a major portion of a side surface of the cuboid-shaped package and is intended to remain un-encapsulated by the device package (not shown in FIG. 9). Consequently, area 950 will be available for radiating off thermal energy, or for attaching a heat sink. In addition, FIG. 9 shows a potential connection 951a to another cooling area 951 extending across another surface of the cuboid-shaped package; area 951 is also available for radiating off thermal energy, of for attaching a heat sink.

Figure 10:
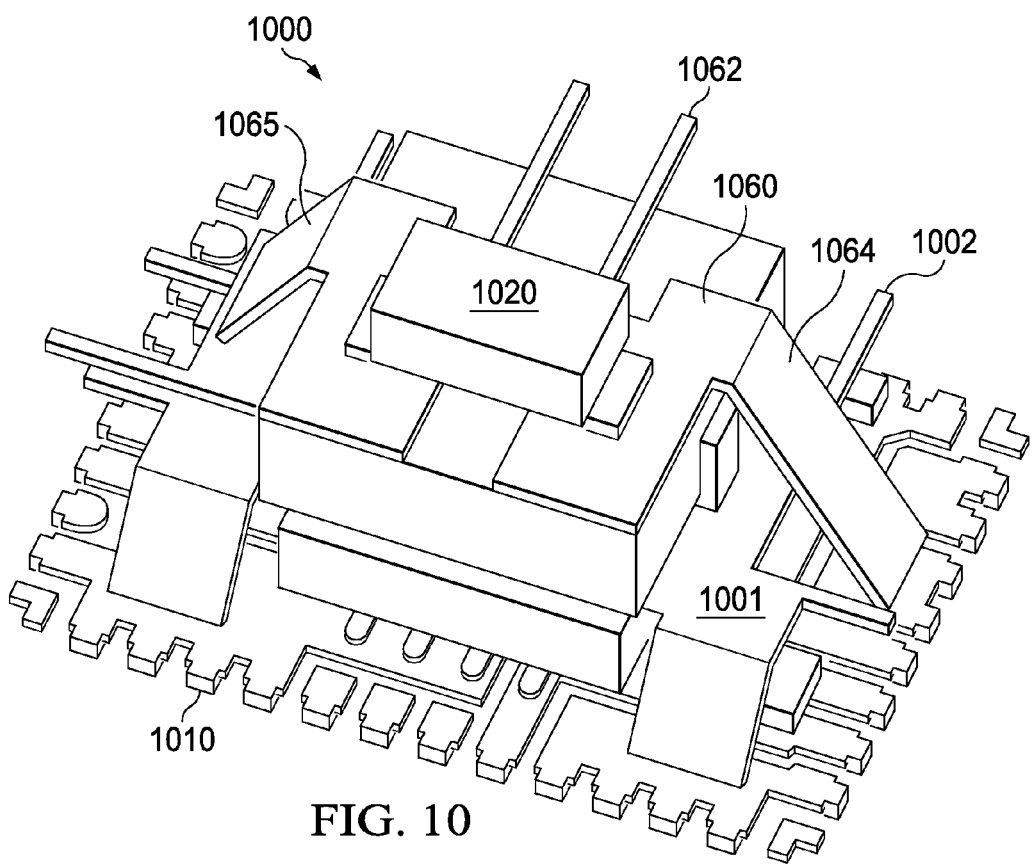
FIG. 10 depicts illustrates a perspective view of a packaged semiconductor device having three planar leadframes configured as modules, with bent leads provided by each planar leadframe establishing connections from one planar leadframe to another planar leadframe.

FIG. 10 depicts another exemplary device 1000 with multi-level leadframes configured as modules. In addition to first planar leadfarme 1001 and second planar leadframe 1010, device 1000 includes a third planar leadframe 1060 with pads for attaching electronic components 1020. As FIG. 10 shows, third leadframe 1060 is conductively connected by bent elongated leads 1064 to second leadframe 1010 and by bent elongated leads 1065 to first leadframe 1001. First leadframe 1001 has leads 1002, and third leadframe 1060 has leads 1062, which are available not only for interconnection within their respective leadframes, but also for eventual exposure by an encapsulating package. Leads 1002 and 1062 are thus suitable to be tied to external electrical terminals.

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the invention applies to any number of components assembled on the leadframes, with any combination of large-size and small-size, packaged and un-packaged components.

As another example, the method can be extended to any number of leadframes with bent leads so that the leadframes can be vertically stacked to make contact to parallel leadframes and components positioned below or on top on the stack.

As another example, some leads of the plurality of leadframe can remain exposed when the devices are encapsulated in packaging material. The exposed leads may offer electrical access to the stacked system from various sides of the packaged stack.

As another example, since many leads and pads can be designed for heat spreading, thermal energy can be dissipated from various levels of the assembled stack, optimizing the thermal characteristics of the system.

It is therefore intended that the appended claims encompass any such modifications or embodiments.

I claim:

1. A modular system in package semiconductor device with a plurality of interconnect levels comprising:
    a first pre-assembled modular subassembly comprising:
        a planar leadframe with set of first leads;
        pads having attached electronic components; and
        a first set of elongated leads bent in a first direction away from the plane of the planar leadframe;
    a second planar leadframe with second set of leads and pads having attached electronic components;
    the bent leads of the first pre-assembled modular subassembly leadframe conductively connected to the second planar leadframe, forming a conductively linked 3-dimensional network between attached electronic components and sets of leads in two planes; and
    packaging material encapsulating portions of the 3-dimensional network.

2. The device of claim 1 wherein at least portions of the first and second leads are un-encapsulated by the packaging material, the un-encapsulated lead portions operable as electrical device terminals.

3. The device of claim 2 wherein the terminals are located in more than one plane of the device encapsulation.

4. The device of claim 2 further including a third planar leadframe with pads having attached electronic components, the third leadframe conductively connected to the second leadframe by bent elongated leads of a third set.

5. The device of claim 1 further including a second set of elongated leads of the first leadframe, the second set leads bent in a second direction away from the plane of the first leadframe, the second direction opposite to the first direction.

6. The device of claim 5 wherein leads of the third leadframe are suitable to be tied to external electrical terminals.

7. The device of claim 1 wherein the first pre-assembled modular subassembly leadframe is made of a first metal and the second leadframe is made of a second metal different from the first metal.

8. The device of claim 1 wherein the elongated leads have a geometry suitable to spread and dissipate heat.

9. The device of claim 1 wherein leads of the first pre-assembled modular subassembly leadframe are suitable to be tied to external electrical terminals.

10. The device of claim 1 wherein the electronic components include packaged and unpackaged active and passive semiconductor components, including heat-generating components.

11. The device of claim 10 wherein the passive components include inductors, capacitors, and resistors.

12. The device of claim 1 wherein the packaging material is configured to allow the attachment of a heat sink.

* * * * *